United States Patent
Amminudin (10) Patent No.: US 10,088,507 B2
(45) Date of Patent: Oct. 2, 2018

(54) ENERGY PERFORMANCE METRIC IN HYDROCARBON-PRODUCING FACILITIES

(71) Applicant: Saudi Arabian Oil Company, Dhahran (SA)

(72) Inventor: Kamarul Ariffin Amminudin, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 547 days.

(21) Appl. No.: 14/559,639

(22) Filed: Dec. 3, 2014

(65) Prior Publication Data
US 2016/0161536 A1 Jun. 9, 2016

(51) Int. Cl.
*G01R 21/133* (2006.01)
*C10G 99/00* (2006.01)
(Continued)

(52) U.S. Cl.
CPC ........... *G01R 21/133* (2013.01); *C10G 99/00* (2013.01); *G05B 23/0294* (2013.01);
(Continued)

(58) Field of Classification Search
CPC ......... Y02E 20/16; Y02E 20/18; Y02E 50/18; Y02E 60/366; Y02E 60/526;
(Continued)

(56) References Cited

U.S. PATENT DOCUMENTS

| 7,233,910 B2 | 6/2007 | Hileman et al. |
| 2010/0200229 A1* | 8/2010 | Jefferd ...................... C01B 3/32 166/272.2 |

(Continued)

FOREIGN PATENT DOCUMENTS

| CN | 200944255 | 9/2007 |
| CN | 102622521 | 8/2012 |

(Continued)

OTHER PUBLICATIONS

US 8,697,896, 04/2014, Bleyer et al. (withdrawn)
(Continued)

*Primary Examiner* — James G Norman
(74) *Attorney, Agent, or Firm* — Fish & Richardson P.C.

(57) ABSTRACT

A hydrocarbon-producing facility includes a first energy subsystem to receive input energy from an energy source and byproduct energy generated by a second energy subsystem connected to the first energy subsystem, the first energy subsystem to perform work using the input energy and the byproduct energy. A method of analyzing energy performance in the hydrocarbon-producing facility includes identifying the byproduct energy received by the first energy subsystem from the second energy subsystem over a duration, determining energy intensity indices at corresponding time instants during the duration for the first energy subsystem, each energy intensity index based on the input energy, the byproduct energy, and output parameters of the work performed using the input energy and the byproduct energy, comparing the energy intensity indices to each other, and determining an efficiency of the first energy subsystem in response to comparing the energy intensity indices to each other.

16 Claims, 4 Drawing Sheets

(51) Int. Cl.
*G05B 23/02* (2006.01)
*G06Q 10/04* (2012.01)
*G06Q 10/06* (2012.01)
*G06Q 50/04* (2012.01)
*G06Q 50/06* (2012.01)

(52) U.S. Cl.
CPC ............ *G06Q 10/04* (2013.01); *G06Q 10/06* (2013.01); *G06Q 10/0639* (2013.01); *G06Q 50/04* (2013.01); *G06Q 50/06* (2013.01); *Y02P 90/30* (2015.11)

(58) Field of Classification Search
CPC ..... Y02E 20/185; Y02E 60/50; Y02E 60/566; Y02E 20/14; Y02E 50/32; Y02E 50/343; Y02E 60/563; Y02E 20/12; Y02E 20/326; Y02E 20/344; F23J 2215/20; F23J 15/025; F23J 15/04; F23J 15/06; F23J 2217/101; F23J 2219/40; F23J 2219/10; F23J 2900/15061; F23J 7/00; Y02B 90/14; Y02B 90/12; Y02B 90/16; F01K 13/00; F01K 23/10
See application file for complete search history.

(56) References Cited

U.S. PATENT DOCUMENTS

2014/0026085 A1* 1/2014 Amminudin ........ G06F 3/04842
715/764
2014/0123620 A1* 5/2014 Huntington ............. F02C 3/107
60/39.52
2015/0106058 A1* 4/2015 Mazzaro ............. G01M 99/005
702/181

FOREIGN PATENT DOCUMENTS

| CN | 102768702 | 11/2012 |
| EP | 2343791 | 7/2011 |
| JP | 2006192714 | 7/2006 |

OTHER PUBLICATIONS

International Search Report and Written Opinion of the International Searching Authority issued in International Application No. PCT/US2015/054648 on Dec. 11, 2015; 10 pages.

* cited by examiner

ENERGY PERFORMANCE METRIC IN HYDROCARBON-PRODUCING FACILITIES

TECHNICAL FIELD

This disclosure relates to energy performance analyses in manufacturing or operating facilities, e.g., upstream hydrocarbon oil-gas producing facilities where crude oil from reservoirs is processed before being exported or refined.

BACKGROUND

Energy performance metrics are normally used in an operating facility to measure how energy efficient the facility is with respect to a given target or Key Performance Indicator (KPI). One of the commonly used energy metrics is the energy intensity index, defines as a total energy consumed per unit of production. Hence, the lower the energy intensity index, the higher the energy efficiency of a given facility is.

SUMMARY

This disclosure describes energy performance metrics in a hydrocarbon-producing facility.

In some aspects, a hydrocarbon-producing facility can include a first energy subsystem to receive input energy from an energy source and byproduct energy generated by a second energy subsystem connected to the first energy subsystem, the first energy subsystem to perform work using the input energy and the byproduct energy. In some aspects, a method of analyzing energy performance in the hydrocarbon-producing facility includes identifying the byproduct energy received by the first energy subsystem from the second energy subsystem over a duration, determining a plurality of energy intensity indices at a corresponding plurality of time instants during the duration for the first energy subsystem, each energy intensity index based on the input energy, the byproduct energy, and output parameters of the work performed using the input energy and the byproduct energy, comparing the plurality of energy intensity indices to each other, and determining an efficiency of the first energy subsystem in response to comparing the plurality of energy intensity indices to each other.

This, and other aspects, can include one or more of the following features. The first energy subsystem can be a hydrocarbon subsystem including a boiler, where the input energy can include boiler fuel and input power for hydrocarbon power processes, and where the byproduct energy can include steam energy from a heat recovery steam generator. Determining an energy intensity index at a time instant can include dividing a net energy consumed by the first energy subsystem by a total output of the first energy subsystem at the time instant, where the net energy consumed by the first energy subsystem can include the input energy consumed in the time instant subtracted by the byproduct energy consumed in the time instant, and the total output of the first energy subsystem can include a total production volume of the output parameters in the time instant. The duration can be a plurality of days and each time instant in the plurality of time instants can correlate to each day in the plurality of days. Determining an efficiency of the first energy subsystem can include determining that the plurality of energy intensity indices is increasing over the duration and determining that the first energy subsystem is inefficient. The method can include finding an inefficiency source within the first energy subsystem. Finding an inefficiency source within the first energy subsystem can include comparing energy consumption of each component in the first subsystem over the duration. Determining an efficiency of the first energy subsystem can include determining that the plurality of energy intensity indices is not increasing over the duration and determining that the first energy subsystem is efficient. The second energy subsystem can be a water injection subsystem including a gas turbine, a water injection pump, and a water disposal pump, an input energy to the water injection subsystem can include gas turbine fuel, water injection pump power, and water disposal pump power, and the byproduct energy can include steam energy generated from exhaust heat of the gas turbine by a heat recovery steam generator. The method can include determining a plurality of energy intensity indices for the second energy subsystem at the corresponding plurality of time instants during the duration. The method can include determining a plurality of energy intensity indices for the hydrocarbon producing facility at the corresponding plurality of time instants during the duration.

Some aspects of the subject matter described here can be implemented as a computer implemented method of analyzing energy performance in a hydrocarbon-producing facility, the hydrocarbon-producing facility including a first energy subsystem to receive input energy from an energy source and byproduct energy generated by a second energy subsystem connected to the first energy subsystem, and the first energy subsystem to perform work using the input energy and the byproduct energy. The computer-implemented method includes, in the hydrocarbon-producing facility, identifying the byproduct energy received by the first energy subsystem from the second energy subsystem over a duration, determining a plurality of energy intensity indices at a corresponding plurality of time instants during the duration for the first energy subsystem, each energy intensity index based on the input energy, the byproduct energy, and output parameters of the work performed using the input energy and the byproduct energy, comparing the plurality of energy intensity indices to each other, and determining an efficiency of the first energy subsystem in response to comparing the plurality of energy intensity indices to each other.

This, and other aspects, can include one or more of the following features. The first energy subsystem can be a hydrocarbon subsystem including a boiler, where the input energy can include boiler fuel and input power for hydrocarbon power processes, and where the byproduct energy can include steam energy from a heat recovery steam generator. Determining an energy intensity index at a time instant can include dividing a net energy consumed by the first energy subsystem by a total output of the first energy subsystem at the time instant, where the net energy consumed by the first energy subsystem can include the input energy consumed in the time instant subtracted by the byproduct energy consumed in the time instant, and the total output of the first energy subsystem can include a total production volume of the output parameters in the time instant. The computer implemented method can include determining a plurality of energy intensity indices for the second energy subsystem at the corresponding plurality of time instants during the duration. The duration can be a plurality of days and each time instant in the plurality of time instants can correlate to each day in the plurality of days.

Some aspects of the subject matter described here can be implemented as a non-transitory, computer-readable medium storing instructions operable when executed by one or more processors to perform operations. The operations include, in a hydrocarbon-producing facility including a first energy subsystem to receive input energy from an energy source and byproduct energy generated by a second energy subsystem connected to the first energy subsystem, the first energy subsystem to perform work using the input energy and the byproduct energy, identifying the byproduct energy received by the first energy subsystem from the second energy subsystem over a duration. The operations further include determining a plurality of energy intensity indices at a corresponding plurality of time instants during the duration for the first energy subsystem, each energy intensity index based on the input energy, the byproduct energy, and output parameters of the work performed using the input energy and the byproduct energy, comparing the plurality of energy intensity indices to each other, and determining an efficiency of the first energy subsystem in response to comparing the plurality of energy intensity indices to each other.

This, and other aspects, can include one or more of the following features. The first energy subsystem can be a hydrocarbon subsystem including a boiler, where the input energy can include boiler fuel and input power for hydrocarbon power processes, and where the byproduct energy can include steam energy from a heat recovery steam generator. Determining an energy intensity index at a time instant can include dividing a net energy consumed by the first energy subsystem by a total output of the first energy subsystem at the time instant, where the net energy consumed by the first energy subsystem can include the input energy consumed in the time instant subtracted by the byproduct energy consumed in the time instant, and the total output of the first energy subsystem can include a total production volume of the output parameters in the time instant. The operations can include determining a plurality of energy intensity indices for the second energy subsystem at the corresponding plurality of time instants during the duration.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This disclosure describes methods of analyzing energy performance in a facility, such as a hydrocarbon-producing facility and/or integrated oil processing facility. An example hydrocarbon-producing facility includes at least two energy subsystems, such as a hydrocarbon subsystem and a water injection subsystem. The hydrocarbon subsystem receives crude hydrocarbon product, for example, from a well reservoir producing upstream of the hydrocarbon-producing facility, and processes the crude hydrocarbon product into stabilized oil, gas, and/or natural gas liquid (NGL). Upstream and downstream refers to, for example, the stream of hydrocarbon product from a reservoir upstream of the flow of hydrocarbon product to a processing facility and/or to other locations downstream of the flow of hydrocarbon product. The hydrocarbon subsystem can include an oil-gas separator, gas compression trains, oil stabilization unit, gas conditioning system, and/or other equipment that provides energy utilities to the hydrocarbon subsystem, such as a boiler for steam generation, and power. The water injection subsystem handles produced water from the hydrocarbon subsystem and, in some instances, seawater from a water source, and discharges a water output back into the upstream well reservoir. The water injection subsystem can include a gas turbine that drives a water injection pump for pumping the water output to the well reservoir, a disposal pump for pumping produced water from the hydrocarbon subsystem to the water injection pump, and/or other equipment. A free energy transfer link connects the hydrocarbon subsystem and the water injection subsystem such that a byproduct energy from one subsystem is used as an input energy in the other subsystem. A byproduct energy, for example, includes energy generated by a subsystem that, if not consumed by the subsystem that generated it, is unused, unmeasured, and/or otherwise secondary to an intentional output of the subsystem. For example, a free energy transfer link can include a heat recovery steam generator, where excess heat from the gas turbine of the water injection subsystem is captured by the heat recovery steam generator, converted into steam energy, and transported to the hydrocarbon subsystem for use in the hydrocarbon power processes. The excess heat is a byproduct of the water injection subsystem, the heat recovery steam generator is the free energy transfer link between the water injection subsystem and the hydrocarbon subsystem, and the steam energy is a byproduct energy used by the hydrocarbon subsystem.

An energy performance analysis of the example hydrocarbon-producing facility includes determining an efficiency of the subsystems in the hydrocarbon-producing facility using an energy performance metric, for example, an energy intensity index (EII). An energy intensity index is a measurement of performance efficiency that correlates to the net amount of energy used to produce a unit of product. In other words, an energy intensity index is a ratio of input to output for a respective subsystem or facility. In some examples, an input for a subsystem includes input fuel, input power, byproduct energy from another subsystem, and/or other input parameters. An output for the subsystem includes output parameters such as output production volume, output production rate, and/or other. A respective energy intensity index can be determined for each of the hydrocarbon subsystem of the hydrocarbon-producing facility, the water injection subsystem of the hydrocarbon producing facility, the complete hydrocarbon-producing facility, and/or other subsystems or facilities. For example, an energy intensity index for the hydrocarbon subsystem incorporates an input power, input fuel, output product, and byproduct energy (e.g., steam energy) from the free energy transfer link. In some implementations, an energy intensity index can be determined at each of multiple time instants during a duration for one or more subsystems of a hydrocarbon-producing facility. An observed trend in energy intensity indices over the duration can lead to a determination of performance efficiency. A determination of performance efficiency can include determining whether the energy efficiency has improved, worsened, or stayed the same, and/or whether the energy efficiency target or KPI has been met or otherwise.

In some implementations, measuring an energy performance metric (i.e., energy intensity index) for subsystems linked by a free energy transfer link over a duration provides a more precise and accurate depiction of subsystem and/or facility efficiency. In certain instances, measuring energy performance metrics of subsystems, as opposed to measuring an energy performance metric of a total facility, provides a more accurate revealing of any sources of inefficiency within the total facility. Sources of inefficiency can include devices, equipment, operating strategies, and/or other aspects or components involved in the consumption of energy and/or the production of a product in a facility. In certain implementations, measuring an energy intensity index for individual subsystems of a facility presents a loss opportunity for the subsystem, and thus the facility, to improve and optimize efficiency, for example, by highlighting an underlying inherent inefficiency. In some instances, the loss opportunity correlates to a loss in energy saving opportunities, especially with such opportunities that can be realized right away through some no-cost operational improvement efforts and yet the facility simply cannot leverage such an advantage. This kind of loss opportunity can be presented in terms of either potential financial loss to the facility or the energy intensity index performance, if there is no effort to implement such an opportunity. Such a financial loss opportunity can serve as a key decision parameter, either a strong or weak justification, for a change to take place that can significantly aid a facility management team and/or facility operator to decide on implementing the change.

An example to illustrate a loss opportunity in terms of energy intensity index is presented. An example plant normally runs four processing oil trains on a given day to process a crude oil production input. Sometimes, the production rate of the crude oil production input can be processed using only three processing oil trains, but operational and safety requirements of upstream activities suggest or necessitate the use of four processing oil trains of the example plant. Running four oil processing trains, instead of three trains, has caused the example plant to lose the opportunity to improve the energy index from, for example, 62 MMBtu/MBOE (running 4 trains) to 58 MMBtu/MBOE (running 3 trains) for a given day. Based on this loss opportunity figure from the energy intensity index, a plant operator can realize the loss opportunity and a potential benefit in the next day by shutting down one train. Otherwise, the example plant simply misses the opportunity to improve its energy intensity index the following day. From the financial loss, this can be translated into the loss opportunity for not being able to use the available crude for export. Instead, this available crude is used for generating energy unnecessarily. In this example, the loss crude can be valued around $20 MM/year at the crude price of $90/bbl. In another scenario, the loss opportunity can be translated into a loss production opportunity following insufficient energy available to generate 'additional' products, as the extra energy supposedly to generate additional products has been consumed unnecessarily earlier due to inherent inefficiency of certain equipment or operations in the facility. In certain instances, the loss opportunity can be quantified financially in terms of loss production value. In some implementations, the loss opportunity can be used as a 'flag' highlighting a driving force for improvement effort in many ways, without which can be difficult to rationalize or justify the improvement effort.

Figure 1:
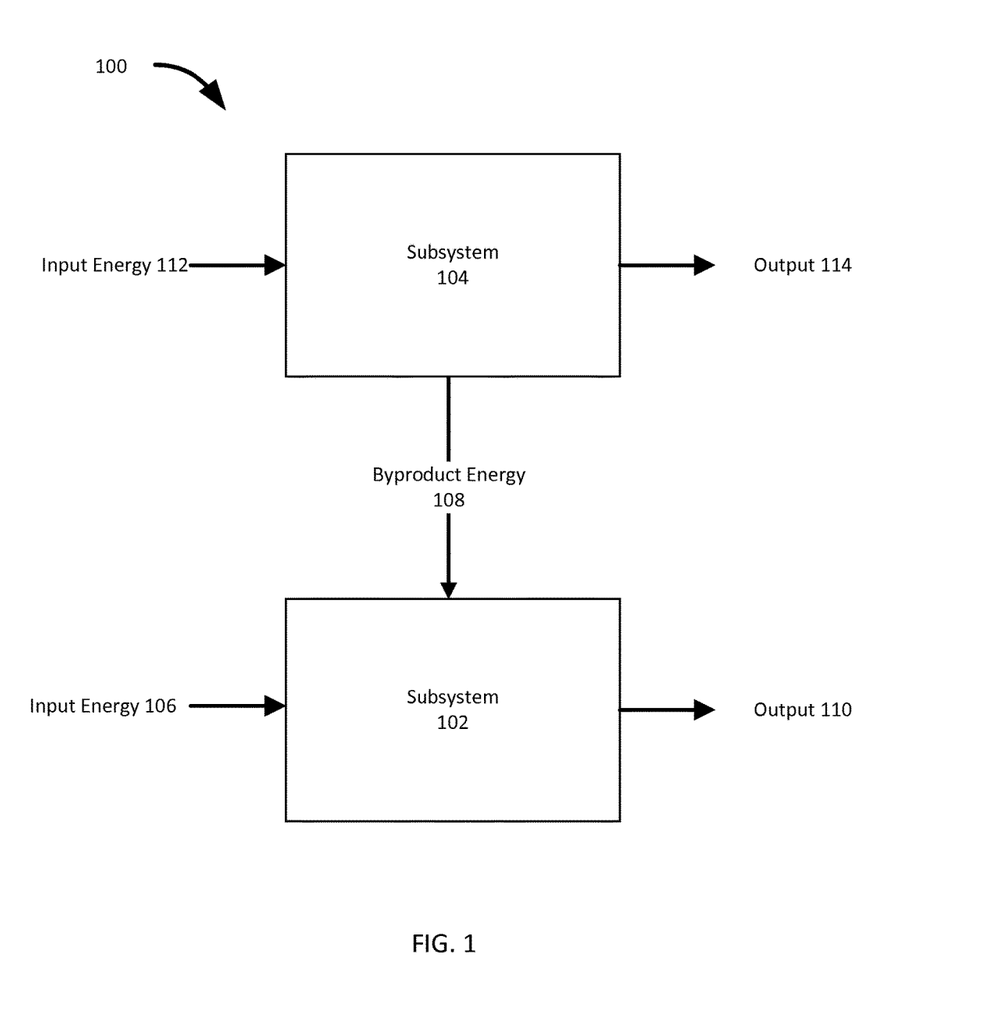
FIG. 1 is a schematic diagram of an example facility including two subsystems.

FIG. 1 is a schematic diagram 100 of an example facility including two subsystems 102 and 104. The first subsystem 102 receives a first input energy 106 and a byproduct energy 108 (e.g., via a free energy link) generated by the second subsystem 104. The byproduct energy 108, for example, includes free energy generated by the second subsystem 104 that is not consumed by the second subsystem 104 and is secondary to an intentional output of the second subsystem 104. The first subsystem 102 performs work using the input energy 106 and the byproduct energy 108. In some implementations, the first subsystem 102 emits an output 110, for example, in the form of a final product, waste product, and/or other output parameter of the work performed by the first subsystem 102 using the input energy 106 and the byproduct energy 108. In certain implementations, such as depicted in FIG. 1, the second subsystem 104 receives a second input energy 112, performs work using the second input energy 112, and emits an output 114. The output 114, for example, can be in the form of a final product, waste product, and/or other output parameter of the work performed by the second subsystem 104 using the input energy 112.

In some implementations, an energy intensity index, defined by the ratio of net energy input to production output, can be determined for the total facility, for example, based on the input energy 106, output 110, input energy 112, and output 114. In some examples, the energy intensity index can be identified as:

$$\frac{\text{Input Energy 106} + \text{Input Energy 112}}{\text{Output 110} + \text{Output 114}}$$

Since the byproduct energy 108 is produced and consumed within operations of the facility, the byproduct energy 108 does not factor into the energy intensity index of the total facility. However, the byproduct energy 108 received by the first energy subsystem 102 is identified over a duration and implemented in a calculation of an energy intensity index of the first subsystem 102. For example, an energy intensity index of the first energy subsystem 102 can be identified as:

$$\frac{\text{Input Energy 106} - \text{Byproduct Energy 108}}{\text{Output 110}}$$

In some examples, an energy intensity index of the second energy subsystem 104 can be identified as:

$$\frac{\text{Input Energy 112} - \text{Byproduct Energy 108}}{\text{Output 114}}$$

The byproduct energy 108 is free energy that, if not used by the first energy subsystem 102, would be unused, unmeasured, and/or transported to other operations. As depicted above, the byproduct energy 108 factors into the energy intensity index of both the first subsystem 102 and the second subsystem 104. However, in some implementations, the byproduct energy 108 factors into the energy intensity index of the first subsystem 102, but does not factor into the energy intensity index of the second subsystem 104.

Multiple energy intensity indices for the first energy subsystem 102 are determined at corresponding time instants during a specified duration, where each energy intensity index is based on the input energy 106, byproduct energy 108, and output 110. The duration and the time instants can take a variety of time interval forms. In some implementations, the duration is multiple days and each time instant in the multiple time instants correlates to each day in the multiple days. The time instant can be the same on each of the multiple days. In some examples, the duration can span one or more hours, days, weeks, months, and/or other. The time interval can be set accordingly and can offer flexibility to a user or operator of a subsystem.

In some implementations, the time instant is instead a sub-duration within the duration. For example, an energy intensity index can be measured for a sub-duration within the duration, where a value for an input and/or output at a time instant is a cumulative value of the input and/or output during the sub-duration. The sub-duration can be one or more minutes, hours, days, weeks, months, and/or other.

The multiple energy intensity indices of the first energy subsystem 102 are compared to each other to determine an efficiency of the first energy subsystem 102 based on the comparison of the energy intensity indices. In some examples in which the multiple energy intensity indices decrease over the duration, the first energy subsystem 102 is determined to be efficient (e.g., more efficient than the state of the first energy subsystem 102 at a first, or previous, time instant of the duration) because the input energy needed to produce the same unit of output decreases. In some examples in which the multiple energy intensity indices remain substantially constant over the duration, the first energy subsystem 102 can be determined to be substantially as efficient as it was at the first time instant of the duration because the input energy needed to produce the same unit of output stays substantially the same. In some examples in which the multiple energy intensity indices increase over the duration, the first energy subsystem 102 is determined to be inefficient (e.g., determined to be less efficient than the state of the first energy subsystem 102 at a first, or previous, time instant of the duration) because the input energy needed to produce the same unit of output increases. In some implementations, determining that the multiple energy intensity indices increase over the duration includes determining that an inefficiency source (e.g., device, machinery, equipment, and/or other component) exists in the first subsystem 102. In certain implementations, finding an inefficiency source within the first energy subsystem 102 includes measuring energy consumption of each component in the first energy subsystem 102 over the duration and comparing the energy consumptions of the multiple components in the first energy subsystem 102.

In some implementations, multiple energy intensity indices for the second energy subsystem 104 are determined at specified time instants for a duration. The time instants used to measure the energy intensity indices for the second energy subsystem 104 can be the same or different than the time instants used to measure the energy intensity indices for the first energy subsystem 102. Each energy intensity index for the second energy subsystem 104 is based on the input energy 112, the output 114, and in some implementations, the byproduct energy 108. Similar to the multiple energy intensity indices of first energy subsystem 102, the multiple energy intensity indices of the second energy subsystem 104 can be compared to each other to determine an efficiency of the second energy subsystem 104 based on the comparison of the energy intensity indices.

In some implementations, multiple energy intensity indices for the total facility are determined at specified time instants for a duration. The time instants and duration can be the same or different time instants and duration as used to measure the energy intensity indices for the first energy subsystem 102 and/or second energy subsystem 104. The energy intensity indices for the total facility may increase, decrease, or remain substantially constant over the duration. The increasing, decreasing, and/or constant trend of energy intensity indices for the total facility may be different than the energy intensity indices trends for the first subsystem 102 and/or second subsystem 104. For example, the energy intensity indices for the total facility do not take into account the byproduct energy 108, whereas the energy intensity indices for the first subsystem 102 and/or second subsystem 104 do take into account the byproduct energy 108. In certain implementations, the energy intensity indices for the first subsystem 102 and/or second subsystem 104 are more precise than the energy intensity indices for the total facility, for example, in identifying an inefficiency source within the facility. In some examples, an energy intensity index for the total facility may stay substantially the same from a first time instant to a second time instant, whereas an energy intensity index for the first subsystem 102 may increase (or decrease) from the first time instant to the second time instant. An increase in the energy intensity index for the first subsystem 102 may reveal an inefficiency source within the first subsystem 102 that would not be readily noticed if observing only an energy intensity index of the total facility.

Figure 2:
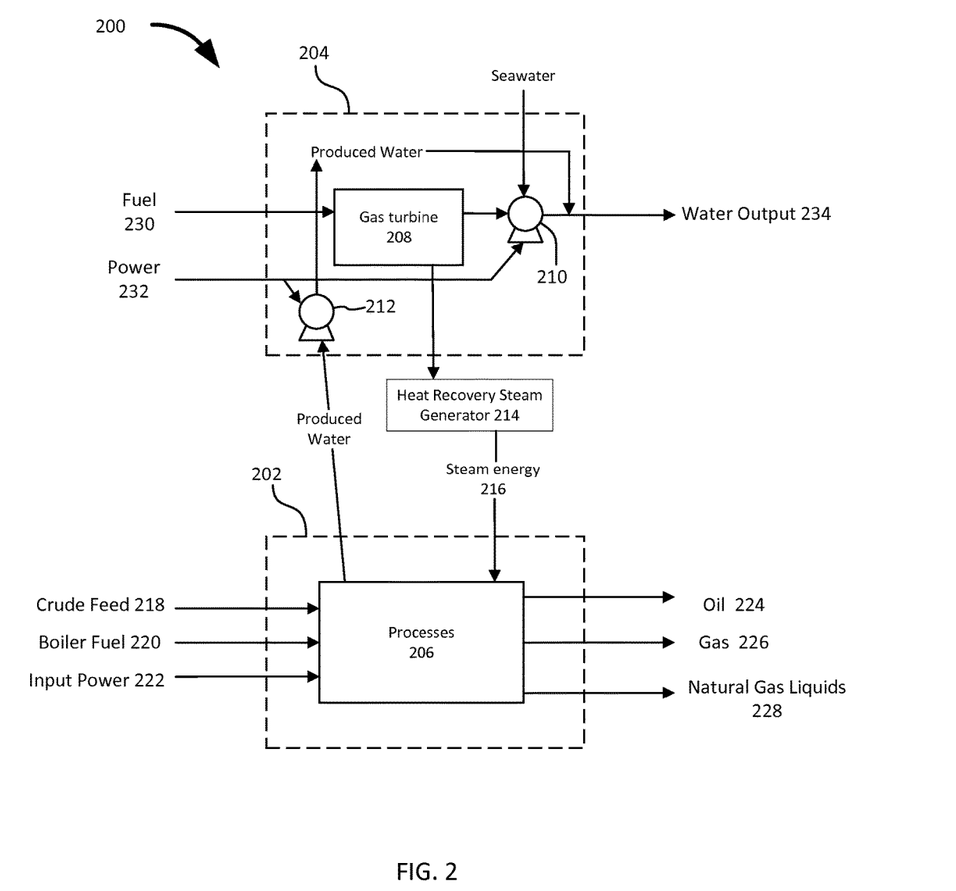
FIG. 2 is a schematic diagram of an example hydrocarbon-producing facility including a hydrocarbon subsystem and a water injection subsystem.

FIG. 2 is a schematic diagram 200 of an example hydrocarbon-producing facility including two subsystems, a hydrocarbon subsystem 202 and a water injection subsystem 204. The schematic diagram 200 is like the schematic diagram 100 of FIG. 1, with the hydrocarbon subsystem 202 like the first energy subsystem 102 of FIG. 1, and the water injection subsystem 204 like the second energy subsystem 104 of FIG. 1. The schematic diagram 100 of FIG. 1 represents a generic facility, and the schematic diagram of FIG. 2 shows a more specific facility. Although FIG. 2 shows a schematic diagram 200 for an example hydrocarbon-producing facility, the energy performance analysis can be performed on other types of facilities. For example, the energy performance analysis can be performed in oil processing facilities, waste treatment facilities and incinerators, gas-processing and sulfur-recovery plants, petrochemical plants, edible oil refining facilities, food processing plants, automotive manufacturing facilities, and/or other type of facility with a main product subsystem and an unwanted product subsystem connected by a free energy link. A facility can include more than two subsystems, where the energy performance analysis can be performed on one or more or each subsystem of a facility including more than two subsystems.

Referring back to FIG. 2, the hydrocarbon subsystem 202 includes hydrocarbon processes 206 (e.g., a boiler, power supply, gas-liquid separator, water separator, crude oil stabilizer, gas compression system, gas conditioning system, and/or other hydrocarbon production components). The water injection subsystem 204 incudes a gas turbine 208, a water injection pump 210, a water disposal pump 212, and/or other water injection components. The example hydrocarbon-producing facility also includes a heat recovery steam generator 214 to convert excess heat from the gas turbine 208 of the water injection subsystem 204 into steam energy 216 used by the hydrocarbon processes 206 of the hydrocarbon subsystem 202.

The heat recovery steam generator 214 provides the free energy link between the hydrocarbon subsystem 202 and the water injection subsystem 204. The hydrocarbon subsystem 202 receives crude feed 218 (e.g., raw crude oil from a reservoir), boiler fuel 220, input power 222 (e.g., for hydrocarbon processes), and the steam energy 216 via the heat recovery steam generator 214. The hydrocarbon subsystem 202 performs work by processing the crude feed 218, consuming boiler fuel 220, utilizing input power 222 and steam energy 216, and in the example hydrocarbon-producing facility of FIG. 2, emitting at least one of stabilized oil 224, gas product 226, or natural gas liquids (NGL) 228. An energy intensity index can be determined at multiple time instants of a duration for the hydrocarbon subsystem 202 by dividing the net energy consumed by the hydrocarbon subsystem 202 by the total output of the hydrocarbon subsystem 202. For example, for the example hydrocarbon-producing facility depicted in the schematic diagram 200 of FIG. 2, an energy intensity index for the hydrocarbon subsystem 202 can be defined as the following:

$$EII \text{ for Hydrocabon Subsystem } 202 = \qquad (1)$$
$$\frac{\text{Boiler Fuel } 220 + \text{Input Power } 222 - \text{Steam Energy } 216}{\text{Oil } 224 + \text{Gas } 226 + NGL\ 228}$$

The component for steam energy 216 in Equation (1) serves as an energy credit and is a negative (i.e., "free") energy component in the determination of the net energy consumed by the hydrocarbon subsystem 202. The hydrocarbon subsystem 202 can reduce its EII, and thus improve its efficiency, by minimizing the consumption of one or both of the boiler fuel 220 and input power 222 while maximizing the steam energy 216. In some implementations, the consumption of boiler fuel 220 can reach an absolute minimum when the boiler is operating at a minimum load condition, where efforts to further reduce the consumption of boiler fuel 220 become ineffective at reducing the EII calculation. However, increasing effort to maximize steam energy 216 can reduce the EII calculation for the hydrocarbon subsystem 202. In some implementations, the net energy consumed by the hydrocarbon subsystem 202 is in units of BTUs (British thermal units), kilowatts (kW), megawatts (MW), and/or other unit of energy, and the total output of the hydrocarbon subsystem 202 is in units of barrel of oil equivalent (BOE) production rate and/or other production rate.

In the example hydrocarbon-producing facility of FIG. 2, the water injection subsystem 204 receives fuel 230 for the gas turbine 208 and power 232 for the water injection pump 210 and water disposal pump 212. In some instances, the water injection subsystem 204 also receives produced water via the water disposal pump 212 as a result of a crude-water separation operation in the hydrocarbon processes 206 of the hydrocarbon subsystem 202. The water injection subsystem 204 performs work using the fuel 230, power 232, and produced water from the water disposal pump 212, and discharges a water output 234 (e.g., for injection back into a well reservoir). An energy intensity index can be determined at multiple time instants of a duration for the water injection subsystem 204 by dividing the net energy consumed by the water injection subsystem 204 by the total output of the water injection subsystem 204. The net energy consumed includes the fuel 230 and power 232 in units of BTUs, kW, or MW, and the total output is the water output 234 in units of BBL of water production rate. For example, in the example hydrocarbon-producing facility depicted in schematic diagram 200 of FIG. 2, an energy intensity index for the water injection subsystem 204 can be defined as the following:

$$EII \text{ for Water Injection Subsystem } 204 = \qquad (2)$$

-continued
$$\frac{\text{Fuel } 230 + \text{Power } 232 - \text{Steam Energy } 216}{\text{Water Output } 234}$$

The component for steam energy 216 in Equation (2) serves as an energy credit since it is produced (i.e., not consumed) by the water injection subsystem 204, and is a negative (i.e., "free") energy component in the determination of the net energy consumed by the water injection subsystem 204. The steam energy 216 is negative in the sense that the steam energy 216 produced in the water injection subsystem 204 serves as an energy credit. In some implementations, the steam energy 216 is excluded from the determination of energy intensity index for the water injection subsystem 204. In certain implementations when the steam energy 216 decreases to zero (i.e., when the energy credit is zero), the EII for the water injection subsystem 204 increases. For example, the steam energy 216 is zero when the heat recovery steam generator 214 is shut down for maintenance work or unit malfunction.

Referring back to both FIGS. 1 and 2, the byproduct energy 108 (e.g., steam energy 216) can take many forms, such as heat (e.g., hot water), steam, electricity, chilled water, and/or other forms of energy depending on the facility, subsystem(s), energy link, and/or other factors. For example, in FIG. 2, the byproduct energy includes the steam energy 216 from the heat recovery steam generator 214 that converts excess heat (e.g., exhaust heat) from the gas turbine 208 into usable steam energy 216 for the hydrocarbon processes 206 (e.g., boiler) of the hydrocarbon subsystem 202. In determining the steam energy component for use in calculating the energy intensity indices for the hydrocarbon subsystem 202 and/or water injection subsystem 204, data can be collected from the heat recovery steam generator in a variety of ways. In some implementations, the heat recovery steam generator 214 includes internal sensors identifying a steam production rate. For example, based on the steam rate generated by the heat recovery steam generator 214, the steam rate can be converted to the steam energy 216 by conventional thermodynamic calculations involving enthalpy property at the given heat recovery steam generator 214 operation condition.

In some examples, the hydrocarbon-producing facility of FIG. 2 provides given data corresponding to a first time instant in a duration. The given data can include a heat recovery steam generator steam production rate, a boiler steam rate, an oil production rate, a gas production rate, a natural gas liquid production rate, total facility fuel gas usage, total facility power usage, a seawater injection rate, a disposal water injection rate, and/or other given energy or production data. The given data can be converted into units usable in Equations (1) and (2), for example, energy units of BTUs and production units of BOE (or BBL for water output). In order to calculate an energy intensity index for the given hydrocarbon-producing facility (e.g., including a hydrocarbon subsystem and a water injection subsystem), input energy components are converted into units of BTUs, kW, MW, and/or other energy unit, and output parameters are converted into units of BOE production rate (or equivalents thereof). In some implementations, the output parameters are converted into units of total production volume, and/or different units of production rate other than BOE equivalent.

Figure 3:
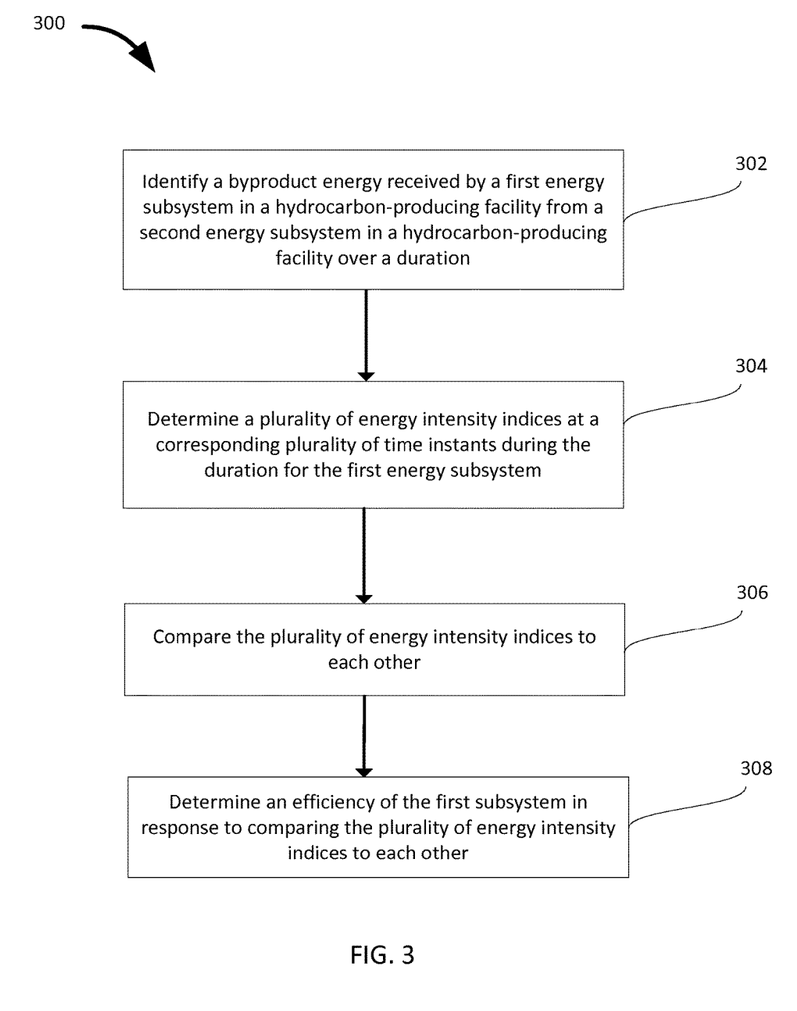
FIG. 3 is a flowchart describing an example process for analyzing energy performance in a hydrocarbon-producing facility.

FIG. 3 is a flowchart describing an example process 300 for analyzing energy performance in a hydrocarbon-producing facility, for example, the example hydrocarbon-producing facility in the schematic diagram 200 of FIG. 2. At 302, a byproduct energy received by a first energy subsystem in a hydrocarbon-producing facility from a second energy subsystem is identified over a duration. At 304, a plurality of energy intensity indices are determined at a corresponding plurality of time instants during the duration for the first energy subsystem. In some implementations, each energy intensity index is based on an input energy from an energy source, the byproduct energy, and output parameters of the work performed using the input energy and the byproduct energy. At 306, the plurality of energy intensity indices are compared to each other. At 308, an efficiency of the first energy subsystem is determined in response to comparing the plurality of energy intensity indices to each other.

Figure 4:
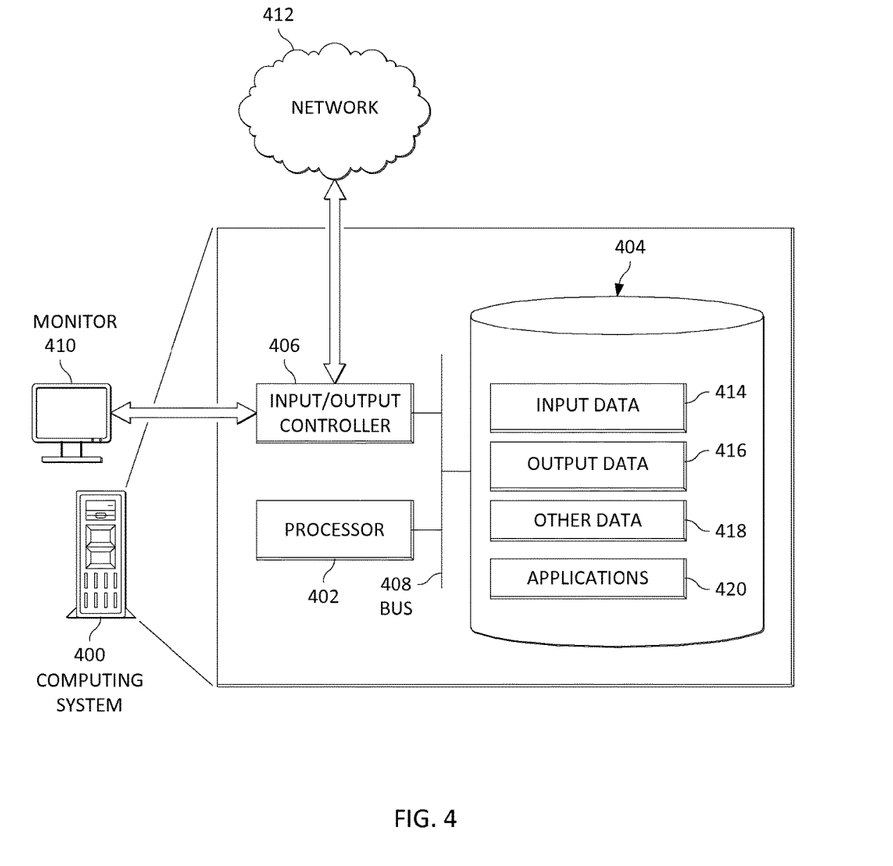
FIG. 4 illustrates an example architecture of an example computing system.

FIG. 4 illustrates an example architecture of an example computing system 400 (e.g., computer) that can implement processes of analyzing energy performance in a hydrocarbon-producing facility, for example, example process 300 of FIG. 3. The example computing system 400 can be located at or near one or more hydrocarbon-producing facilities. The example computing system 400 includes one or more processors 402, a computer-readable medium 404 (e.g., a memory), and input/output controllers 406 communicably coupled by a bus 408. The computer-readable medium 404 can include, for example, a random access memory (RAM), a storage device (e.g., a writable read-only memory (ROM) and/or others), a hard disk, and/or another type of storage medium. The computer-readable medium 404 can include readable and/or writable data including subsystem input data 414, subsystem output data 416, application data 420, and/or other data 418. The computing system 400 can be preprogrammed and/or it can be programmed (and reprogrammed) by loading a program from another source (e.g., from a CD-ROM, from another computing device through a data network, and/or in another manner). The input/output controller 406 is coupled to input/output devices (e.g., monitor 410) and to a network 412. The input/output devices receive and transmit data in analog or digital form over communication links such as a serial link, wireless link (e.g., infrared, radio frequency, and/or others), parallel link, and/or another type of link.

The network 412 can include any type of data communication network. For example, the network 412 can include a wireless and/or a wired network, a Local Area Network (LAN), a Wide Area Network (WAN), a private network, a public network (such as the Internet), a WiFi network, a network that includes a satellite link, and/or another type of data communication network.

A number of implementations have been described. Nevertheless, it will be understood that various modifications may be made without departing from the spirit and scope of the disclosure.

What is claimed is:

1. A method of analyzing energy performance in a hydrocarbon-producing facility, the method comprising:
    in the hydrocarbon-producing facility comprising a hydrocarbon subsystem to receive input energy from an energy source and byproduct energy generated by a second energy subsystem connected to the hydrocarbon subsystem, the hydrocarbon subsystem to perform work using the input energy and the byproduct energy, identifying the byproduct energy received by the hydrocarbon subsystem from the second energy subsystem over a duration, where the hydrocarbon subsystem comprises a boiler, where the input energy comprises boiler fuel and input power for hydrocarbon power processes, and where the byproduct energy comprises steam energy from a heat recovery steam generator;
    determining a plurality of energy intensity indices at a corresponding plurality of time instants during the duration for the hydrocarbon subsystem, each energy intensity index based on the input energy comprising the boiler fuel and input power for hydrocarbon power processes, the byproduct energy comprising the steam energy from the heat recovery steam generator, and output parameters of the work performed using the input energy and the byproduct energy, where the energy intensity index for the hydrocarbon subsystem comprises the ratio of the input energy to the output parameters, where the input energy comprises the boiler fuel plus input power to the hydrocarbon subsystem minus the steam energy from the heat recovery steam generator, and the output parameters comprises at least one of oil, gas, or natural gas liquid outputted from the hydrocarbon subsystem;
    comparing the plurality of energy intensity indices to each other;
    determining an efficiency of the hydrocarbon subsystem in response to comparing the plurality of energy intensity indices to each other, and
    in response to the determined efficiency of the hydrocarbon subsystem, controlling the operation of the heat recovery steam generator.

2. The method of claim 1, wherein determining an energy intensity index at a time instant comprises dividing a net energy consumed by the hydrocarbon subsystem by a total output of the hydrocarbon subsystem at the time instant, where the net energy consumed by the hydrocarbon subsystem comprises the input energy consumed in the time instant subtracted by the byproduct energy consumed in the time instant, and the total output of the hydrocarbon subsystem comprises a production volume of the output parameters in the time instant.

3. The method of claim 1, wherein the duration is a plurality of days and each time instant in the plurality of time instants correlate to each day in the plurality of days.

4. The method of claim 1, wherein determining an efficiency of the hydrocarbon subsystem comprises determining that the plurality of energy intensity indices is increasing over the duration and determining that the hydrocarbon subsystem is inefficient.

5. The method of claim 1, further comprising finding an inefficiency source within the hydrocarbon subsystem.

6. The method of claim 5, wherein finding an inefficiency source within the hydrocarbon subsystem comprises comparing energy consumption of each component in the hydrocarbon subsystem over the duration.

7. The method of claim 1, wherein determining an efficiency of the hydrocarbon subsystem comprises determining that the plurality of energy intensity indices is not increasing over the duration and determining that the hydrocarbon subsystem is efficient.

8. The method of claim 1, wherein the second energy subsystem is a water injection subsystem comprising a gas turbine, a water injection pump, and a water disposal pump;
    wherein an input energy to the water injection subsystem comprises gas turbine fuel, water injection pump power, and water disposal pump power; and
    wherein the steam energy is generated by the heat recovery steam generator from exhaust heat of the gas turbine.

9. The method of claim 1, comprising determining a plurality of energy intensity indices for the second energy subsystem at the corresponding plurality of time instants during the duration.

10. The method of claim 1, wherein controlling the operation of the heat recovery steam generator comprises shutting down the heat recovery steam generator.

11. The method of claim 1, wherein controlling the operation of the heat recovery steam generator comprises increasing steam generation of steam energy from the heat recovery steam generator and reducing consumption of boiler fuel by the boiler.

12. A system, comprising:
a hydrocarbon subsystem comprising a boiler, the boiler to receive input energy comprising boiler fuel and input power for hydrocarbon power processes, and byproduct energy;
a heat recovery steam generator connected to the hydrocarbon subsystem, the heat recovery steam generator to generate the byproduct energy, where the byproduct energy comprises steam energy, and where the hydrocarbon subsystem is configured to perform work using the input energy and the steam energy; and
a computer system connected to the hydrocarbon subsystem and the heat recovery steam generator, the computer system configured to execute computer instructions stored on a computer-readable medium to perform operations comprising:
identifying the steam energy received by the boiler from the heat recovery steam generator over a duration;
determining a plurality of energy intensity indices at a corresponding plurality of time instants during the duration for the hydrocarbon subsystem, each energy intensity index based on the input energy comprising the boiler fuel and input power for hydrocarbon power processes, the byproduct energy comprising the steam energy from the heat recovery steam generator, and output parameters of the work performed using the input energy and the byproduct energy, where the energy intensity index for the hydrocarbon subsystem comprises the ratio of the input energy to the output parameters, where the input energy comprises the boiler fuel plus input power to the hydrocarbon subsystem minus the steam energy from the heat recovery steam generator, and the output parameters comprises at least one of oil, gas, or natural gas liquid outputted from the hydrocarbon subsystem;
comparing the plurality of energy intensity indices to each other;
determining an efficiency of the hydrocarbon subsystem in response to comparing the plurality of energy intensity indices to each other, and
in response to the determined efficiency of the hydrocarbon subsystem, controlling the operation of the heat recovery steam generator.

13. The system of claim 12, wherein the duration is a plurality of days and each time instant in the plurality of time instants correlate to each day in the plurality of days.

14. The system of claim 12, further comprising a water injection subsystem connected to the heat recovery steam generator, the water injection subsystem comprising a gas turbine, a water injection pump, and a water disposal pump;
wherein an input energy to the water injection subsystem comprises gas turbine fuel, water injection pump power, and water disposal pump power; and
wherein exhaust heat of the gas turbine is provided to the heat recovery steam generator to produce the steam energy generated by the heat recovery steam generator.

15. The system of claim 12, wherein controlling the operation of the heat recovery steam generator comprises shutting down the heat recovery steam generator.

16. The system of claim 12, wherein controlling the operation of the heat recovery steam generator comprises increasing steam generation of steam energy from the heat recovery steam generator and reducing consumption of boiler fuel by the boiler.

* * * * *